(12) United States Patent
Watanabe et al.

(10) Patent No.: US 7,312,528 B2
(45) Date of Patent: Dec. 25, 2007

(54) SEMICONDUCTOR DEVICE HAVING ANTENNA CONNECTION ELECTRODES

(75) Inventors: Hiroto Watanabe, Tsukuba (JP);
Osamu Nakayama, Tokyo (JP);
Osamu Shiratsuchi, Yokohama (JP);
Kazuhiko Daido, Moriya (JP)

(73) Assignee: Hitachi Maxell, Ltd., Ibaraki-Shi (JP)

( * ) Notice: Subject to any disclaimer, the term of this patent is extended or adjusted under 35 U.S.C. 154(b) by 88 days.

(21) Appl. No.: 10/778,234

(22) Filed: Feb. 17, 2004

(65) Prior Publication Data
US 2004/0159932 A1    Aug. 19, 2004

(30) Foreign Application Priority Data
Feb. 18, 2003    (JP)    ............... 2003-039647

(51) Int. Cl.
*H01L 23/48*    (2006.01)
*H01L 23/52*    (2006.01)
*H01L 23/522*    (2006.01)

(52) U.S. Cl. .............. 257/728; 257/E23.064; 257/693; 257/690; 257/664; 257/700; 257/701; 257/528; 257/532; 257/784; 343/700 MS; 343/895; 343/702; 343/873

(58) Field of Classification Search ........ 257/E23.064, 257/693, 784, 690, 700, 701, 728, 723–725, 257/528, 532, 421, 685, 679, 24, 192, 777, 257/664, 668, 686, 240; 343/700 MS, 767, 343/895, 702, 873, 846; 361/720
See application file for complete search history.

(56) References Cited

U.S. PATENT DOCUMENTS

| | | | | |
|---|---|---|---|---|
| 5,519,582 A | * | 5/1996 | Matsuzaki | ................. 361/783 |
| 5,612,532 A | * | 3/1997 | Iwasaki | ..................... 235/492 |
| 6,255,725 B1 | * | 7/2001 | Akagawa et al. | ........... 257/679 |
| 6,421,013 B1 | * | 7/2002 | Chung | ................. 343/700 MS |
| 6,424,263 B1 | * | 7/2002 | Lee et al. | ................ 340/572.7 |
| 6,424,315 B1 | * | 7/2002 | Glenn et al. | ................ 343/895 |
| 6,583,762 B2 | * | 6/2003 | Hamada | .............. 343/700 MS |
| 6,639,299 B2 | * | 10/2003 | Aoki | ........................... 257/531 |
| 6,665,193 B1 | * | 12/2003 | Chung et al. | ............... 361/760 |
| 6,666,380 B1 | * | 12/2003 | Suzuya | ....................... 235/492 |
| 6,724,347 B2 | * | 4/2004 | Tomomatsu et al. | . 343/700 MS |

(Continued)

FOREIGN PATENT DOCUMENTS

EP    1184807    *    3/2002

(Continued)

*Primary Examiner*—Alexander Oscar Williams
(74) *Attorney, Agent, or Firm*—Birch, Stewart, Kolasch & Birch, LLP (57) ABSTRACT

A semiconductor device includes first and second antenna connection electrodes placed on the periphery of a semiconductor chip, an on-chip antenna connection electrode placed in the inner area of the semiconductor chip compared to the first and second antenna connection electrodes, and an internal circuit formed in the semiconductor chip. The first and second antenna connection electrodes are connected to the internal circuit by internal lines. The on-chip antenna connection electrode is connected to the internal circuit and the second antenna connection electrode by internal lines. An on-chip antenna is connected to the second antenna connection electrode and the on-chip antenna connection electrode. An external antenna is connected to the first and second antenna connection electrodes.

12 Claims, 5 Drawing Sheets

U.S. PATENT DOCUMENTS

| | | | |
|---|---|---|---|
| 6,727,862 B2* | 4/2004 | Tomon ..................... 343/895 |
| 6,734,760 B2* | 5/2004 | Tsujiguchi ................. 333/172 |
| 6,818,985 B1* | 11/2004 | Coccioli et al. ............ 257/728 |
| 6,825,809 B2* | 11/2004 | Aoki et al. .......... 343/700 MS |
| 6,885,354 B2* | 4/2005 | Takei ....................... 343/870 |
| 6,900,536 B1* | 5/2005 | Derbenwick et al. ....... 257/724 |
| 2001/0004136 A1* | 6/2001 | Ikeda et al. ................. 257/778 |
| 2002/0089049 A1* | 7/2002 | Leduc et al. ................ 257/679 |
| 2002/0113682 A1* | 8/2002 | Gevorgian et al. .......... 336/200 |
| 2002/0140609 A1* | 10/2002 | Aoki et al. .......... 343/700 MS |
| 2002/0149086 A1* | 10/2002 | Aoki ......................... 257/528 |
| 2003/0025186 A1* | 2/2003 | Leduc et al. ................ 257/679 |
| 2003/0030593 A1* | 2/2003 | Tomomatsu et al. ........ 343/895 |
| 2003/0042572 A1* | 3/2003 | Detcheverry et al. ....... 257/533 |
| 2003/0085454 A1* | 5/2003 | Reutner et al. ............. 257/679 |
| 2003/0140489 A1* | 7/2003 | Kishimoto et al. ........... 29/832 |
| 2003/0218573 A1* | 11/2003 | Yoo et al. ................... 343/702 |
| 2004/0117985 A1* | 6/2004 | Chung et al. ................ 29/840 |
| 2005/0024176 A1* | 2/2005 | Wang et al. ................ 336/200 |

FOREIGN PATENT DOCUMENTS

| | | | |
|---|---|---|---|
| JP | 2000-323643 A | | 11/2000 |
| JP | 2000-348153 | * | 12/2000 |
| JP | 2001-028037 | | 1/2001 |
| JP | 2001-326319 | * | 11/2001 |
| JP | 2001-351082 A | | 12/2001 |
| JP | 2002-037425 A | | 2/2002 |
| JP | 2002-49902 | * | 2/2002 |

* cited by examiner

SEMICONDUCTOR DEVICE HAVING ANTENNA CONNECTION ELECTRODES

CROSS-REFERENCE TO RELATED APPLICATION

The present invention is related to Japanese Patent Application Serial No. 2003-039647, which is hereby incorporated.

BACKGROUND OF THE INVENTION

1. Field of the Invention

The present invention relates to a semiconductor device and, more particularly, to arrangement of antenna connection electrodes formed on a semiconductor chip used in a radio-frequency identification (RF-ID) system allowing for non-contact data communication with an external unit, and so on.

2. Description of the Related Art

A semiconductor device called RF-ID that communicates with a reader/writer unit has been proposed. The semiconductor device has an antenna for non-contact communication with the reader/writer unit. The antenna is usually provided outside of the semiconductor chip and connected to an electrode formed on the semiconductor chip by bonding or other techniques. Such antennas are referred to hereinafter as external antennas. In recent techniques, the antenna is mounted on the semiconductor chip for the purpose of reducing the size of the semiconductor modules and so on. Such antennas are referred to hereinafter as on-chip antennas.

In the connection of the external antenna, two external antenna connection electrodes are generally placed on the periphery of the semiconductor chip since they are usually connected to the external antenna by bonding.

In the connection of the on-chip antenna, on the other hand, one on-chip antenna connection electrode is placed at the center of the semiconductor chip and the other is placed on the periphery of the chip, for example. A coil-shaped on-chip antenna is connected between these electrodes. Alternatively, as described in Japanese Unexamined Patent Application Publication No. 2001-351082, it has been proposed to form two electrodes (terminals 21A and 22A in FIG. 6 of the above publication) on the periphery of the semiconductor chip and then extend one electrode (the terminal 21A) by rewiring to form an electrode (the terminal 21B) at the center of the chip.

In the semiconductor chip where the two external antenna connection electrodes are placed on its periphery, however, mounting the multi-turn coil antenna requires a multi layer antenna structure since it is unable to connect the antenna between the electrodes with a single layer structure. On the other hand, in the semiconductor chip where the on-chip antenna electrodes are placed at the center and on the periphery, connecting the external antenna has a problem that the electrodes are so close as to cause short-circuit in an antenna connection process.

Further, the configuration shown in Japanese Unexamined Patent Application Publication No. 2001-351082 has a problem of requiring an additional manufacturing process and an extra manufacturing cost to reposition the electrode to the center by rewiring. Besides, since the electrode (the terminal 21A in FIG. 6 of the above publication) after rewiring is covered with an insulating layer, the external antenna should be connected to the terminal (the terminal 22B) on the periphery and also to the terminal (the terminal 21B) formed at the center by rewiring. The electrode at the center and the terminal of the external antenna are apart, causing low yield.

Further, conventional techniques have only proposed the semiconductor chips allowing only exclusive use for either external antennas or on-chip antennas. A semiconductor chip compatible with both external antennas and on-chip antennas has not been invented.

SUMMARY OF THE INVENTION

In view of the foregoing, it is an object of the present invention to provide a semiconductor device compatible with both an external antenna and an on-chip antenna.

It is another object of the present invention to provide a semiconductor device which can be easily manufactured.

To these ends, according to one aspect of the present invention, there is provided a semiconductor device including a first electrode (for example, an antenna connection electrode pad 2 in an embodiment of this invention) placed in the periphery of a semiconductor chip, for connection to an on-chip antenna and an external antenna; a second electrode (for example, an antenna connection electrode pad 1a) placed in the periphery of the semiconductor chip, for connection to an external antenna; an on-chip antenna connection electrode (for example, an antenna connection electrode pad 1b) placed in the inner area of the semiconductor chip compared to the first electrode and the second electrode; and a circuit formed in the semiconductor chip, wherein the first electrode and the second electrode are connected to the circuit by internal lines, and the on-chip antenna connection electrode is connected to the circuit and the first electrode by internal lines. The semiconductor device having this configuration is compatible with both an external antenna and an on-chip antenna. Further, since the on-chip antenna connection electrode is connected to the first electrode by an internal line, a manufacturing process and manufacturing cost can be reduced compared to the case of providing a connection by rewiring.

The first electrode and the second electrode are preferably placed near different corners of the semiconductor chip. This allows the electrodes to be sufficiently apart from each other when connecting an external antenna by wire bonding, thereby reducing short circuit between the electrodes.

According to another aspect of the present invention, there is provided a semiconductor device including a first electrode placed in the periphery of a semiconductor chip, for connection to an on-chip antenna and an external antenna; a second electrode placed in the periphery of the semiconductor chip, for connection to an external antenna; an on-chip antenna connection electrode placed in the inner area of the semiconductor chip compared to the first electrode and the second electrode; and a circuit formed in the semiconductor chip, wherein the first electrode and the second electrode are connected to the circuit by internal lines, the on-chip antenna connection electrode is connected to the circuit and the first electrode by internal lines, and the on-chip antenna connection electrode and the first electrode are connected to an on-chip antenna formed thereabove with an insulating layer interposed therebetween.

According to another aspect of the present invention, there is provided a semiconductor device including a first electrode placed in the periphery of a semiconductor chip; a second electrode placed in the periphery of the semiconductor chip; an on-chip antenna connection electrode placed in the inner area of the semiconductor chip compared to the first electrode and the second electrode; a circuit formed in the semiconductor chip; and an external antenna connected to the first electrode and the second electrode, wherein the first electrode and the second electrode are connected to the circuit by internal lines, and the on-chip antenna connection electrode is connected to the circuit and the first electrode by internal lines.

According to another aspect of the present invention, there is provided a semiconductor device including an external antenna connection electrode placed in the periphery of a semiconductor chip; an on-chip antenna connection electrode placed in the inner area of the semiconductor chip compared to the external antenna connection electrode; and a circuit formed in the semiconductor chip, wherein the external antenna connection electrode is connected to the circuit by an internal line, and the on-chip antenna connection electrode is connected to the circuit and the external antenna connection electrode by internal lines.

In another aspect, the on-chip antenna connection electrode is preferably produced by creating an opening in an insulating layer deposited above an electrode formed in the semiconductor chip. The internal lines are preferably formed inside the semiconductor chip. It is also preferred that the on-chip antenna connection electrode is placed at the center of the semiconductor chip. The principal surface of the on-chip antenna connection electrode is preferably smaller than that of the first electrode and the second electrode.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Figure 1:
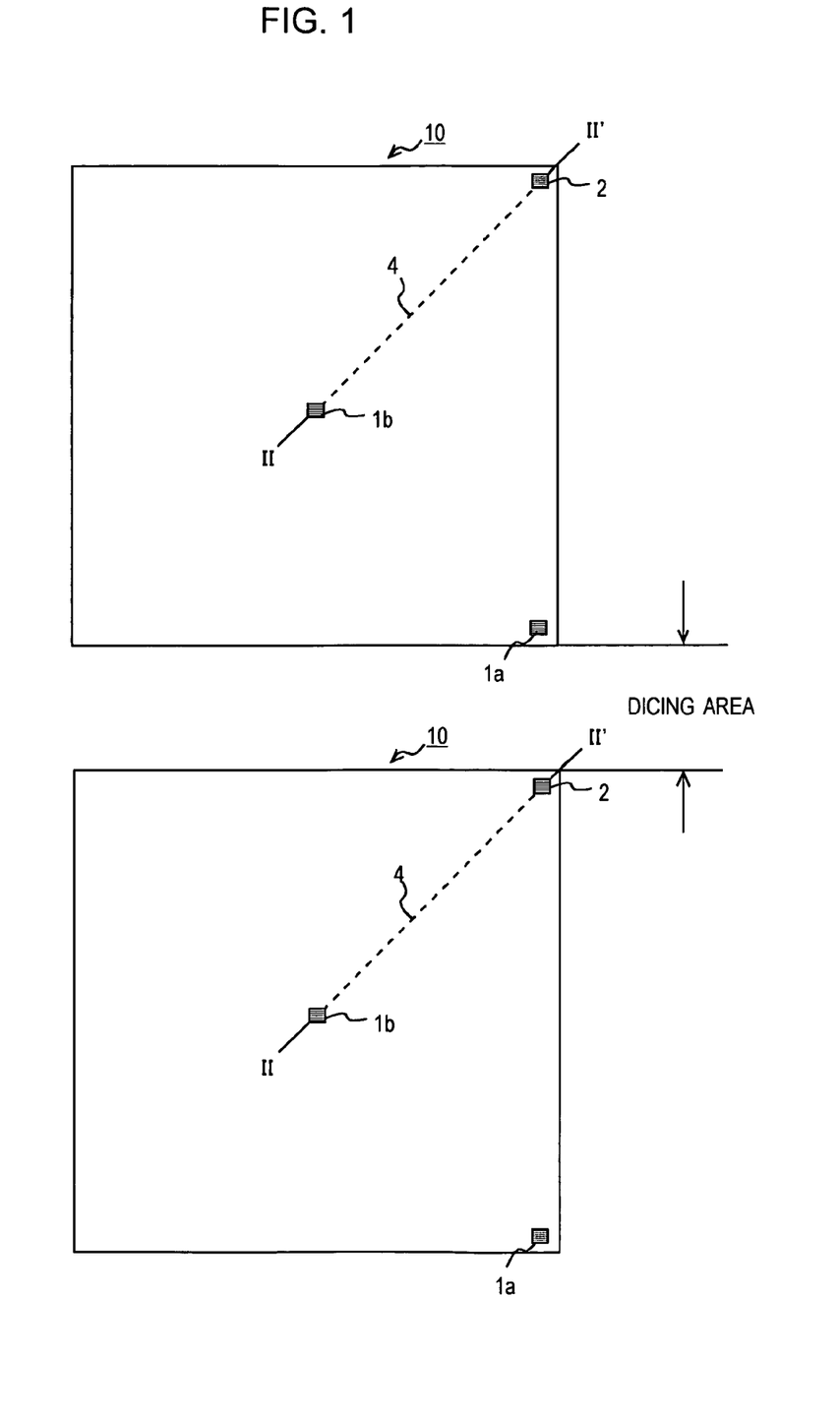
FIG. 1 is a view showing a wiring example in a semiconductor device according to an embodiment of the present invention.

A semiconductor chip which is a semiconductor device according to an embodiment of this invention will be explained hereinafter with reference to the accompanying drawings. Referring first to FIG. 1, it shows a wiring example for antenna connection pads of semiconductor chips 10 before an on-chip antenna or an external antenna is connected.

FIG. 1 illustrates two of the semiconductor chips 10 on a wafer, and between the semiconductor chips 10 is a dicing area. The semiconductor chips 10 have a plurality of circuit blocks, for example. The circuit blocks contain memory for storing information such as identification information to identify data or chip, and a logic control circuit such as CPU. The memory may be composed of ROM, RAM, EEPROM, FRAM and so on. The logic control circuit may be implemented with CPU or wired logic.

The semiconductor chip 10 communicates with a reader/writer unit based on identification information using the on-chip antenna or the external antenna connected thereto. It also performs certain processes using the logic control circuit contained therein. The circuit block further has a transmission circuit including a demodulation circuit and a modulation circuit, and a power supply circuit for converting received radio wave to electric power. The modulation circuit and the demodulation circuit are controlled by the logic control circuit and begin each operation in synchronism with a clock.

The demodulation circuit in the transmission circuit detects the received radio wave and demodulates a baseband signal to obtain data. The modulation circuit in the transmission circuit varies carrier wave according to transmission data to generate a transmission signal and sends the transmission signal to the antenna. A modulation method involves ASK (Amplitude Shift Keying) that varies the amplitude of carrier frequency and PSK (Phase Shift Keying) that varies the phase of the carrier. The semiconductor chip 10 contains no battery, and the power circuit obtains operating power by electromagnetic induction from the radio wave received by the antenna connected thereto.

As shown in FIG. 1, antenna connection electrode pads 1a, 1b, and 2 are formed on a surface of the semiconductor chip 10. The antenna connection electrode pads 1a and 2 are placed on the periphery of the semiconductor chip 10. Specifically, the antenna connection pad 1a is positioned near one corner, and the antenna connection pad 2 is positioned near another corner. Though the antenna connection pads 1a and 2 are placed at adjacent corners in this example, they may be placed at opposing corners. The antenna connection electrode pad 1b, on the other hand, is placed in an inner area of the chip surface compared to the antenna connection electrode pads 1a and 2. In this example, the antenna connection electrode pad 1b is positioned at the center of the semiconductor chip 10.

The antenna connection electrode pads 1a and 1b are used for connection to the on-chip antenna. Placing the antenna connection electrode pads 1a and 1b in the positions shown in FIG. 1 enables antenna wiring with a single layer structure, eliminating the need for forming a multilayer structure to cross the antenna wiring area with multi-turn coil (10 to 50 turns).

The antenna connection electrode pads 1a and 2 are used for connection to the external antenna. Each pad is connected to various internal circuits (not shown) in the semiconductor chip 10 by internal lines. The antenna connection electrode pad 1b and the antenna connection electrode pad 2 are also connected by an internal line.

Thus, the antenna connection electrode pad 1b is for connection to the on-chip antenna but not to the external antenna. The antenna connection electrode pad 1a, on the other hand, is for connection to both the on-chip antenna and the external antenna. In other words, the antenna connection electrode pad 1a serves both as the electrode pad for the on-chip antenna and for the external antenna.

FIG. 1 shows only an internal line 4 connecting the antenna connection electrode pad 1b positioned in the inner area of the chip to the external antenna connection electrode pad 2 positioned near the corner of the chip with a dotted line. Other internal lines are not shown in the figure.

The antenna connection electrode pad 1b at the inner area of the chip is preferably as small as possible to reduce the chip size. The antenna connection electrode pads 1a and 2, on the other hand, should be large enough to meet the accuracy limit of a bonding device for connecting the external antenna. It is thus preferred that the principal surface of the antenna connection electrode pad 1b is smaller than that of the antenna connection electrode pads 1a and 2.

Figure 2:
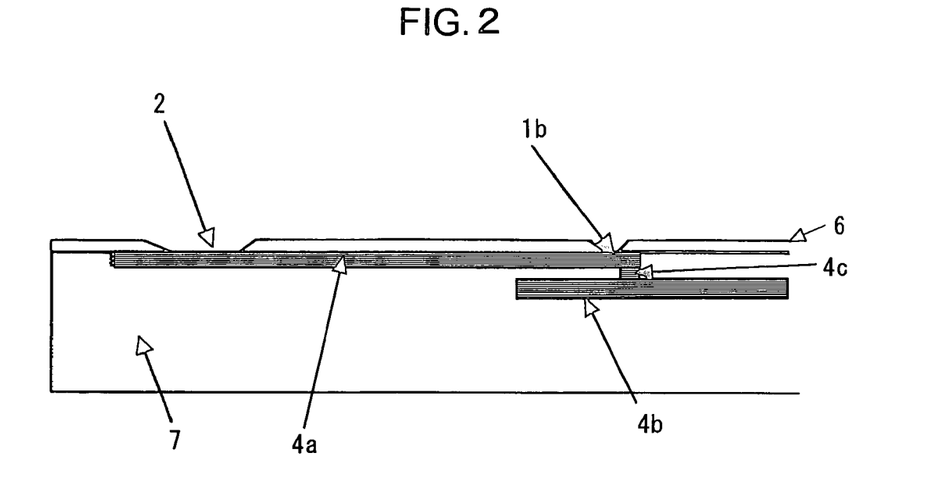
FIG. 2 is a sectional view of a semiconductor device according to an embodiment of the invention.

Referring next to FIG. 2, it shows a fragmentary sectional view of the semiconductor chip 10 according to this embodiment before connection to an antenna. FIG. 2 is a cross-sectional view along line II–II' in FIG. 1. In this example, metal layers 4a and 4b are formed in different layers inside silicon 7. The metal layers 4a and 4b are connected by a via 4c.

The metal layer 4a and the via 4c are internal lines for connecting each of the antenna connection electrode pads 1a, 1b, and 2 to the internal circuits formed inside the chip, and also connecting the antenna connection electrode pad 2 to 1b. The metal layer 4b is a line of the internal circuit formed inside the chip. The metal layers 4 may be formed of Al (aluminum) or Cu (copper), for example.

An insulating layer 6 is formed above the top surface of the silicon 7. A passivation layer (not shown) is usually formed directly below the insulating layer 6. The insulating layer 6 is formed of polyimide, for example.

The insulating layer 6 has an opening in the position corresponding to the periphery of the semiconductor chip 10. The metal layer 4a is partly revealed through the opening of the insulating layer 6. The revealed portion of the metal layer 4a serves as the external antenna connection electrode pad 2.

Besides the opening for the external antenna connection electrode pad 2, the insulating layer 6 has another opening in the inner area of the semiconductor chip 10 to allow connection to the on-chip antenna. The metal layer 4a is partly revealed through this opening. The revealed portion of the metal layer 4a serves as the antenna connection electrode pad 1b.

The semiconductor chip 10 in this configuration allows an external antenna composed of a bulk coil and so on to be connected by bonding via the external antenna connection electrode pad 2 and the antenna connection electrode pad 1a without mounting an on-chip antenna by rewiring. It also allows an on-chip antenna to be mounted thereon by rewiring to electrically connect between the antenna connection electrode pads 1a and 1b. Thus, the semiconductor chip 10 in this embodiment is compatible with both a coil-on-chip RF-ID system using a built-in antenna to allow size reduction, and a RF-ID system using an external antenna to allow long-distance communication.

Now, the configuration of a so-called coil-on-chip semiconductor chip to which an on-chip antenna is connected will be explained hereinafter with reference to FIG. 3.

In a semiconductor chip 30, a pair of the antenna connection electrode pads 1a and 1b is used for connection to the on-chip antenna. An antenna coil 32 which is an on-chip antenna made of copper and the like is connected between the electrode pads 1a and 1b. The semiconductor chip 30 and the antenna coil 32 may be integrally formed. The antenna coil 32 is connected to the internal circuit of the semiconductor chip 30 and also electromagnetically coupled with no contact to a pattern antenna (not shown) in a reader/writer unit to communicate with. The antenna coil 32 and the pattern antenna are in close contact or proximity with each other. The antenna coil 32 functions as a communication unit in the coil-on-chip semiconductor chip.

The antenna coil 32 may have any size, shape, self-inductance, and mutual inductance depending on the position of the pattern antenna, a mounting area, and other conditions. For example, the shape of the coil when seen from above is not limited to a square, and it may be a circle, rectangle, or ellipse.

The semiconductor chip 30 may be the same as the IC device disclosed in Japanese Unexamined Patent Application Publication No. 2000-323643, for example. In the semiconductor chip 30, the rectangular spiral-shaped antenna coil 32 is integrally mounted to the chip surface having the antenna connection electrode pads 1a and 1b that are input/output terminals of the semiconductor chip 30. Between the chip surface and the antenna coil 32 is formed an insulating layer 31, which corresponds to the insulating layer 6 in FIG. 2, that is an insulating protective film such as an oxide silicon film and a resin film. The insulating layer 31 has openings at the positions corresponding to the antenna connection electrode pads 1a and 1b, created by a photolithography process and so on. Through these openings, the antenna coil 32 above the insulating layer 31 is electrically connected to the internal circuit inside the semiconductor chip 30.

The antenna coil 32 preferably has 7 µm or more line width, 5 µm or less interline distance, and 20 or more turns to obtain practically enough electric power and maintain good transmission characteristics with the pattern antenna of the reader/writer unit.

Figure 3:
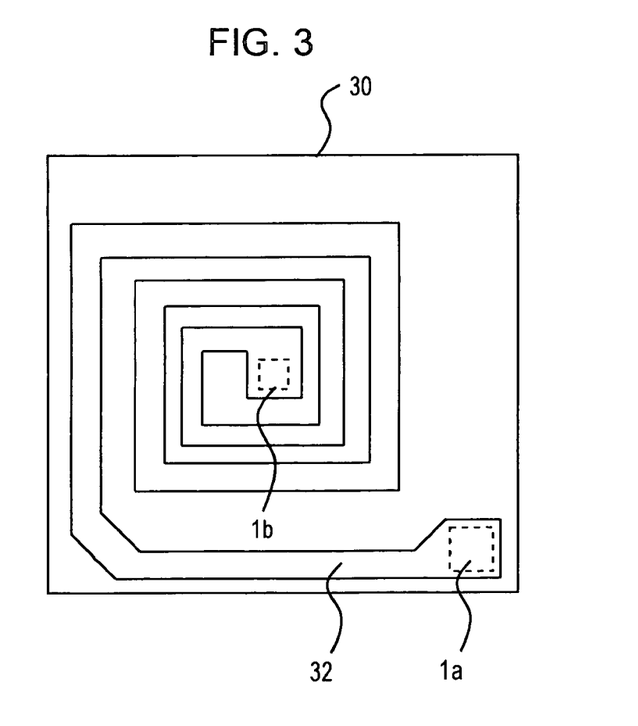
FIG. 3 is a view showing the configuration of a semiconductor device according to an embodiment of the invention.
Figure 4:
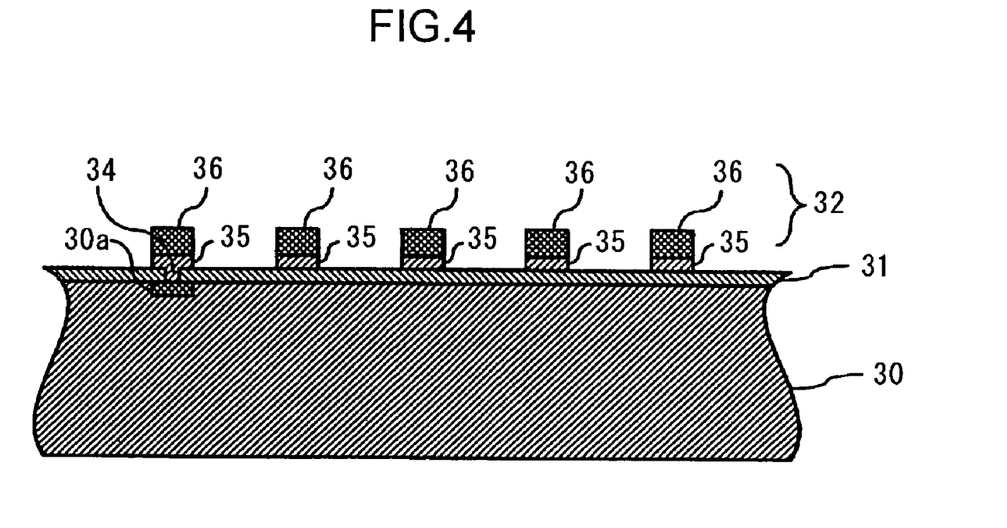
FIG. 4 is a fragmentary sectional view of a semiconductor device according to an embodiment of the invention.

As shown in FIG. 4, the antenna coil 32 is connected to an electrode pad 30a, which corresponds to the electrode pad 1a in FIG. 3, and an electrode pad 30b, which corresponds to the electrode pad 1b in FIG. 3, of the semiconductor chip 30 through an opening 34 in the insulating layer 31. To ensure connection of the antenna coil 32 to the electrode pad 30a in case the antenna coil 32 is mounted slightly off the position, the diameter or width of the opening 34 is preferably smaller than the line width of the antenna coil 32.

A conductor for the antenna coil 32 has a multilayer structure composed of a metal evaporated layer 35 and a metal plated layer 36. The metal evaporated layer 35 and the metal plated layer 36 may be formed of any conductive metal. The metal evaporated layer 35 is preferably formed of a metal selected from aluminum, nickel, copper, and chromium or an alloy of two or more metals selected from the above because they are less costly while having relatively high conductivity. The metal evaporated layer 35 may have a uniform single layer structure or a multilayer structure with a lamination of different metal layers or alloy layers. The metal plated layer 36, on the other hand, is preferably formed of copper. The metal plated layer 36 may be deposited by electroless plating, electroplating, or precise electroforming.

Figure 5:
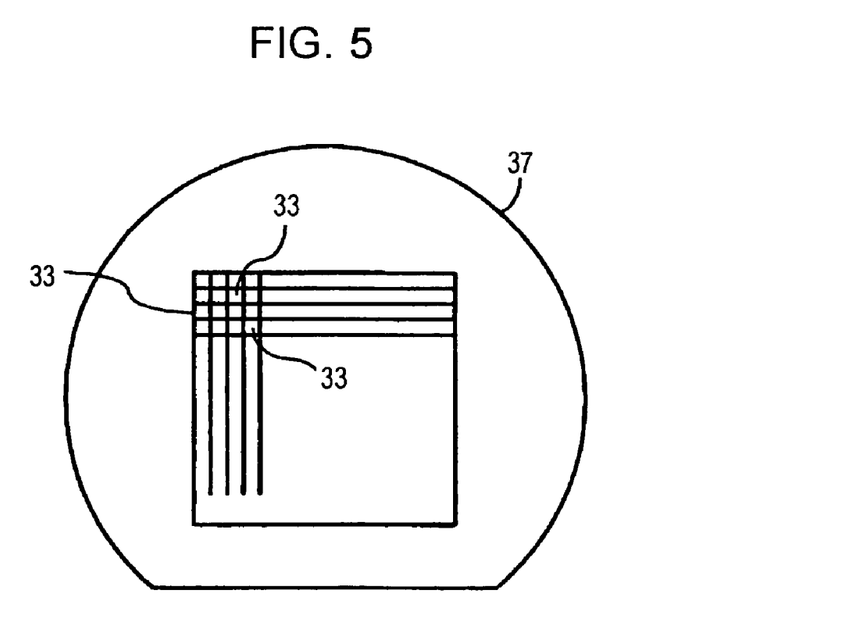
FIG. 5 is a plan view of a finished wafer.

Next, the manufacturing process of the semiconductor chip 30 having the on-chip antenna will be explained with reference to FIGS. 5 and 6. FIG. 5 is a plan view of a so-called finished wafer 37 created by a given process. FIG. 6 shows step diagrams illustrating the manufacturing process of the semiconductor chip 30.

As shown in FIG. 5, a number of IC circuits 33 are formed at regular intervals in the inner area of the finished wafer 37. An insulating layer 31 is deposited in this side of the wafer.

Figure 6A:
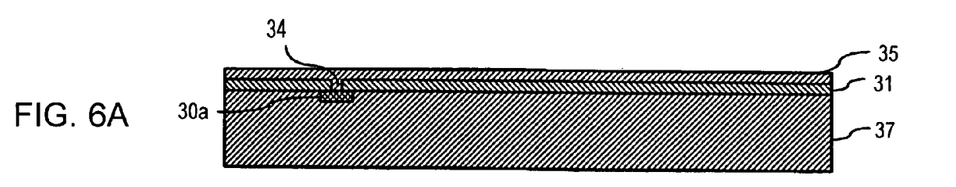
FIG. 6 shows step diagrams illustrating the manufacturing process of a semiconductor device according to an embodiment of the invention.
Figure 6B:
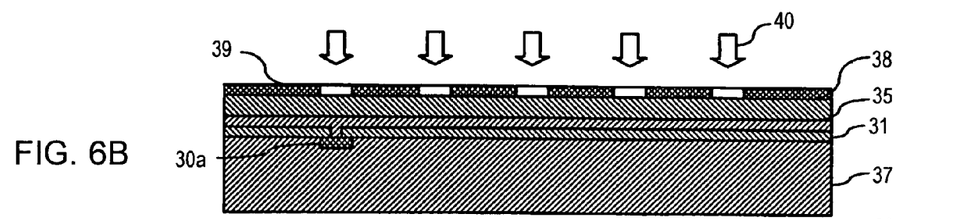
Figure 6C:
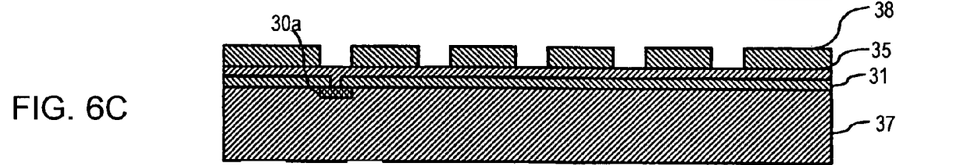
Figure 6D:
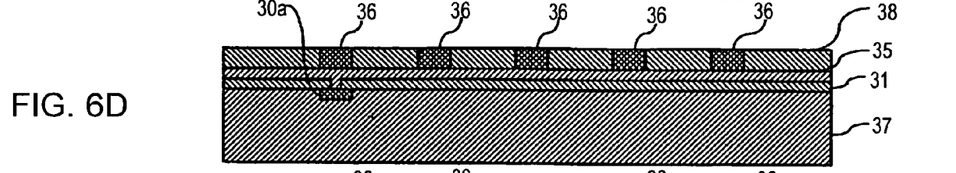
Figure 6E:
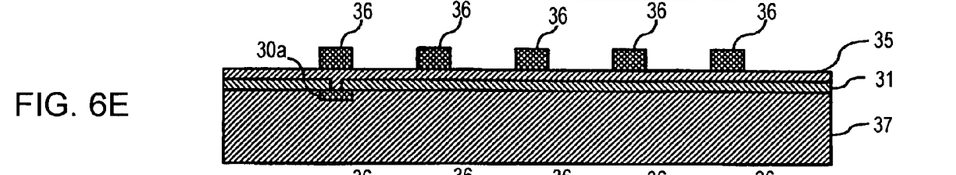
Figure 6F:
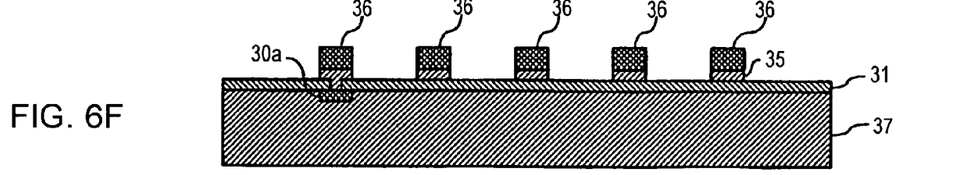

The semiconductor chip 30 having the configuration shown in FIG. 3 is manufactured by the following process. First, as shown in FIG. 6A, the metal evaporated layer 35 is uniformly deposited with aluminum, aluminum alloy, copper, or copper alloy on the insulating layer 31 formed on a circuit surface of the finished wafer 37. Next, as shown in FIG. 6B, a photoresist layer 38 is uniformly deposited on the metal evaporated layer 35. The photoresist layer 38 is then covered with a mask 39 having a necessary pattern including a coil. Over the mask 39, light 40 with a predetermined wavelength is applied to expose the photoresist layer 38. After that, development is performed on the photoresist layer 38 and the exposed part of the photoresist layer 38 is removed to reveal the part of the metal evaporated layer 35 corresponding to the exposure pattern as shown in FIG. 6C. Then, electroplating or precise electroforming is performed on the revealed part of the metal evaporated layer 35 to deposit the metal plated layer 36 thereon as shown in FIG. 6D. The photoresist layer 38 attached to the surface of the finished wafer 37 is then removed by ashing and so on, thereby obtaining the finished wafer 37 where the metal plated layer 36 is deposited on the uniform metal evaporated layer 35 as shown in FIG. 6E. Then, the revealed part of the metal evaporated layer 35 is selectively etched to remove the part not covered with the metal plated layer 36. By this, the finished wafer 37 having a conductive pattern to serve as an antenna coil composed of the metal evaporated layer 35 and the metal plated layer 36 is created. Finally, the finished wafer 37 is diced into separate chips. Antenna integrated semiconductor chips having the configuration shown in FIG. 3 are thereby produced.

Figure 7:
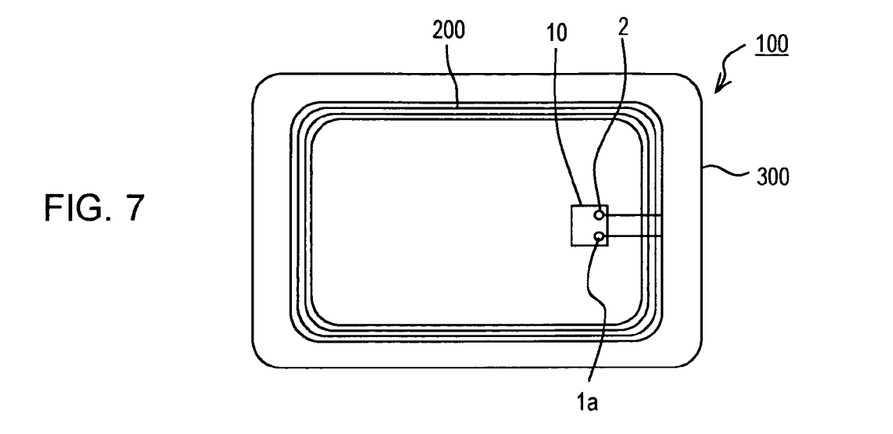
FIG. 7 is a view showing the configuration of a semiconductor device according to an embodiment of the invention.
Figure 8:
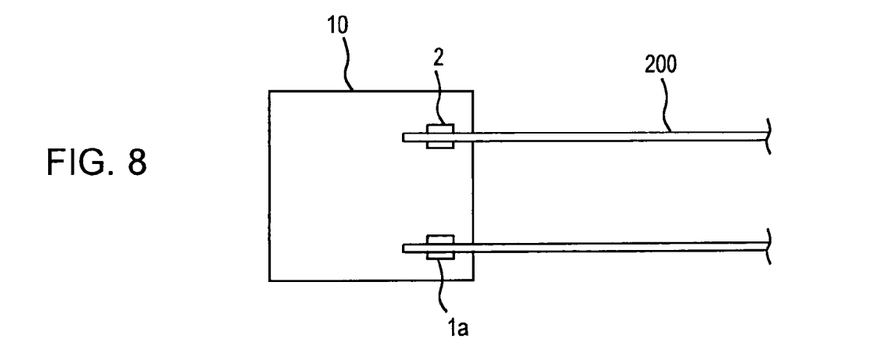
FIG. 8 is a view showing a part of a semiconductor device according to an embodiment of the invention.

Now, the configuration of the semiconductor chip to which an external antenna is connected will be explained hereinafter with reference to FIG. 7 to 9. As shown in FIG. 7 to 9, a flexible IC module 100 in this embodiment includes the semiconductor chip 10 and an external antenna 200 fixed to one side of a thermocompression bonding synthetic resin sheet (flexible base) 300 by thermocompression bonding. The thermocompression bonding synthetic resin sheet 300 may be a hot-melt adhesive molded into a sheet at room temperature. The external antenna 200 is directly connected to the electrode pads 1a and 2 of the semiconductor chip 10. The external antenna 200 is a non-contact transmission coil for receiving with no contact the electric power supplied to the semiconductor chip 10 from a reader/writer unit (not shown) and communicating data with the reader/writer unit with no contact. The semiconductor chip 10 and the external antenna 200 are bonded by thermocompression to the thermocompression bonding synthetic resin sheet 300 so that they are partly buried therein. Alternatively, the chip 10 and the antenna 200 may be completely buried in the sheet 300 by adjusting the thickness of the sheet 300 or the heating, pressure, or other conditions at the thermocompression bonding.

In either case, the electrode pads 1a and 2 are preferably buried in the sheet 300 to protect connections. Thus, in the bonding of the semiconductor chip 10 and the external antenna 200 to the thermocompression bonding synthetic resin sheet 300, thermocompression is applied to the electrode pads 1a and 2 in such a way that the pads are compressed against the sheet 300.

Though any IC chip may be used for the semiconductor chip 10, it is preferred to use a thin film chip with the thickness of 300 µm or less, more preferably 200 µm or less to allow a finished product such as a non-contact IC card to be thinner. Further, when used for a very thin card, the semiconductor chip 10 is desirably as thin as 50 to 150 µm.

The external antenna 200 is formed of a wire with a core wire made of high conductivity metal such as copper and aluminum covered with an insulating layer such as resin. The diameter of the wire for the external antenna 200 is in the range of 20 to 200 µm, selected to be smaller than the length of one side of the electrode pads 1a and 2 of the semiconductor chip 10 so as to ensure the connection of the external antenna 200 to the semiconductor chip 10. The external antenna 200 is produced by coiling up the wire having a desired diameter and coating with several to several dozen turns. A suitable method for direct connection of the external antenna 200 to the semiconductor chip 10 includes wedge bonding, soldering, and welding.

Figure 9A:
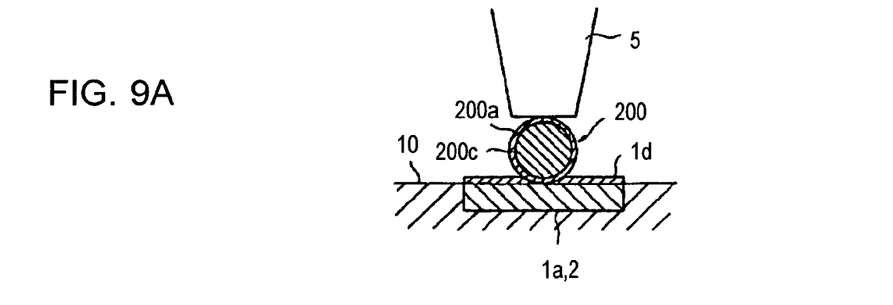
FIG. 9 is a fragmentary sectional view of a semiconductor device according to an embodiment of the invention in its manufacturing process.
Figure 9B:
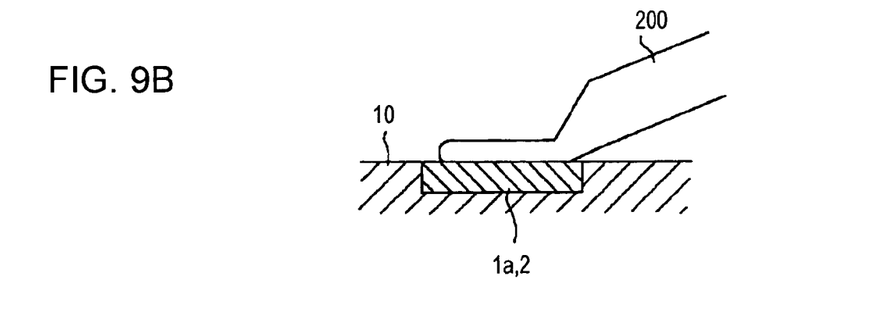

In the case of connecting the external antenna 200 to the semiconductor chip 10 by the wedge bonding, the semiconductor chip 10 with a gold bump or a nickel bump preformed on the electrode pads 1a and 2 is used as shown in FIG. 9A. The use of the nickel bump allows the cost reduction of the semiconductor chip 10 compared to the use of the gold bump. If using the semiconductor chip 10 with the gold or nickel bump 1d formed thereon, the external antenna 200 may have no bonding metal layer 200c; however, the external antenna 200 preferably has the metal layer covering the core wire 200a to facilitate and ensure the bonding. In the wedge bonding of the external antenna 200 to the electrode pads 1a and 2, an edge of the external antenna 200 is placed on the electrode pads 1a and 2. The external antenna 200 is then pressed against the pads with a bonding tool 5 and ultrasonic energy is applied thereto, carbonizing the insulating layer and dissolving the bump 1d as shown in FIG. 9A. The external antenna 200 is thereby directly connected to each of the electrode pads 1a and 2 of the semiconductor chip 10 as shown in FIG. 9B. It is obvious that the external antenna 200 has a smaller wire diameter than the width of the gold or nickel bump 1d as shown in the figures.

The manufacturing process of the semiconductor device according to the present invention is not limited to those described above; it may be manufactured by any process.

As described in the foregoing, the present invention provides a semiconductor device compatible with connection to both an external antenna and an on-chip antenna. The invention also provides a semiconductor device which can be easily manufactured.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor device comprising:
   a first electrode placed in a periphery and on an exposed upper surface of a semiconductor chip, for connection to an on-chip antenna or an external antenna;
   a second electrode placed in a periphery and on the exposed upper surface of the semiconductor chip, for connection to an external antenna;
   an on-chip antenna connection electrode placed in an inner area and on said exposed upper surface of the semiconductor chip compared to the first electrode and the second electrode for connection to an on-chip antenna; and
   a circuit formed in the semiconductor chip,
   wherein the first electrode and the second electrode are connected to the circuit by internal lines, and
   the on-chip antenna connection electrode is connected to the circuit and the second electrode by internal lines.

2. A semiconductor device comprising:
   a first electrode placed in a periphery and on an exposed upper surface of a semiconductor chip, for connection to an on-chip antenna or an external antenna;
   a second electrode placed in a periphery and on the exposed upper surface of the semiconductor chip, for connection to an external antenna;
   an on-chip antenna connection electrode placed in an inner area and on said exposed upper surface of the semiconductor chip compared to the first electrode and the second electrode for connection to an on-chip antenna; and
   a circuit formed in the semiconductor chip,
   wherein the first electrode and the second electrode are connected to the circuit by internal lines, and
   the on-chip antenna connection electrode is connected to the circuit and the second electrode by internal lines;
   wherein the first electrode and the second electrode are placed near different corners of the semiconductor chip.

3. The semiconductor device according to claim 1, wherein
   the on-chip antenna connection electrode and the first electrode are connected to an on-chip antenna formed thereabove with an insulating layer interposed therebetween.

4. The semiconductor device according to claim 1, further comprising:
   an external antenna connected to the first electrode and the second electrode.

5. The semiconductor device according to claim 1, wherein the on-chip antenna connection electrode is produced by creating an opening in an insulating layer deposited above said internal lines.

6. The semiconductor device according to claim 3, wherein the on-chip antenna connection electrode is produced by creating an opening in an insulating layer deposited above said internal lines.

7. The semiconductor device according to claim 4, wherein the on-chip antenna connection electrode is produced by creating an opening in an insulating layer deposited above said internal lines.

8. The semiconductor device according to claim 1, wherein the internal lines are formed inside the semiconductor chip.

9. The semiconductor device according to claim 3, wherein the internal lines are formed inside the semiconductor chip.

10. The semiconductor device according to claim 4, wherein the internal lines are formed inside the semiconductor chip.

11. The semiconductor device according to claim 1, wherein the on-chip antenna connection electrode is placed at a center of the semiconductor chip.

12. A semiconductor device comprising:
   a first electrode placed in a periphery and on an exposed upper surface of a semiconductor chip, for connection to an on-chip antenna or an external antenna;
   a second electrode placed in a periphery and on the exposed upper surface of the semiconductor chip, for connection to an external antenna;
   an on-chip antenna connection electrode placed in an inner area and on said exposed upper surface of the semiconductor chip compared to the first electrode and the second electrode for connection to an on-chip antenna; and
   a circuit formed in the semiconductor chip,
   wherein the first electrode and the second electrode are connected to the circuit by internal lines, and
   the on-chip antenna connection electrode is connected to the circuit and the second electrode by internal lines;
   wherein a principal surface of the on-chip antenna connection electrode is smaller than that of the first electrode and the second electrode.

* * * * *